(12) United States Patent
Kwon et al.

(10) Patent No.: US 7,893,514 B2
(45) Date of Patent: Feb. 22, 2011

(54) IMAGE SENSOR PACKAGE, METHOD OF MANUFACTURING THE SAME, AND IMAGE SENSOR MODULE INCLUDING THE IMAGE SENSOR PACKAGE

(75) Inventors: Woon-Seong Kwon, Gyeonggi-do (KR);
Yong-Hwan Kwon, Gyeonggi-do (KR);
Un-Byoung Kang, Gyeonggi-do (KR);
Chung-Sun Lee, Gyeonggi-do (KR);
Hyung-Sun Jang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 722 days.

(21) Appl. No.: 11/831,768

(22) Filed: Jul. 31, 2007

(65) Prior Publication Data
US 2008/0251872 A1    Oct. 16, 2008

(30) Foreign Application Priority Data
Aug. 1, 2006    (KR) .................... 10-2006-0072660

(51) Int. Cl.
*H01L 31/0203* (2006.01)
*H01L 31/0232* (2006.01)
*H01L 23/02* (2006.01)
*H01L 21/00* (2006.01)

(52) U.S. Cl. .................... 257/433; 257/432; 257/434; 257/680; 257/E23.128; 257/E21.002; 438/116

(58) Field of Classification Search ......... 257/432–434, 257/E27.111, E21.002, 680, E23.128; 438/116
See application file for complete search history.

(56) References Cited

U.S. PATENT DOCUMENTS

| 5,930,610 | A  | * | 7/1999 | Lee .......................... 438/182 |
| 6,900,429 | B1 | * | 5/2005 | Bai et al. .................... 250/239 |
| 7,227,236 | B1 | * | 6/2007 | Lee et al. .................... 257/433 |
| 7,525,167 | B2 | * | 4/2009 | Shizuno ...................... 257/434 |

(Continued)

FOREIGN PATENT DOCUMENTS

JP    2001-358997    12/2001

(Continued)

OTHER PUBLICATIONS

English language abstract of Japanese Publication No. 2001-358997.

(Continued)

*Primary Examiner*—Zandra Smith
*Assistant Examiner*—Jeremy J Joy
(74) *Attorney, Agent, or Firm*—Muir Patent Consulting, PLLC

(57) ABSTRACT

An image sensor package, a method of manufacturing the same, and an image sensor module including the image sensor package are provided. In the image sensor package, an image sensor chip is installed onto a depression of a transmissive substrate. An adhesive bonds the image sensor chip to the transmissive substrate and seals an Active Pixel Sensor (APS) on the image sensor chip, protecting it from fine particle contamination. An IR cutting film is disposed on the transmissive substrate to minimize the height of the image sensor package. The image sensor package is electrically connected to external connection pads in the depression. Consequently, the image sensor package has a minimum height, is not susceptible to particle contamination, and does not require expensive alignment processes during manufacturing.

13 Claims, 6 Drawing Sheets

U.S. PATENT DOCUMENTS

| | | | |
|---|---|---|---|
| 2002/0043720 A1* | 4/2002 | Nakamura | 257/724 |
| 2002/0093078 A1* | 7/2002 | Paek | 257/676 |
| 2004/0211882 A1* | 10/2004 | Hsieh et al. | 250/208.1 |
| 2005/0051859 A1* | 3/2005 | Hoffman | 257/434 |
| 2005/0258518 A1* | 11/2005 | Yang et al. | 257/666 |
| 2006/0016973 A1* | 1/2006 | Yang et al. | 250/239 |
| 2007/0054419 A1* | 3/2007 | Paik et al. | 438/1 |
| 2007/0241273 A1* | 10/2007 | Kim et al. | 250/239 |
| 2008/0048097 A1* | 2/2008 | Chen et al. | 250/208.1 |

FOREIGN PATENT DOCUMENTS

| | | |
|---|---|---|
| KR | 2003-0091389 | 12/2003 |
| KR | 20050093752 | 9/2005 |
| KR | 2005-0120359 | 12/2005 |

OTHER PUBLICATIONS

English language abstract of Korean Publication No. 2003-0091389.
English language abstract of Korean Publication No. 2005-0093752.
English language abstract of Korean Publication No. 2005-0120359.

* cited by examiner

IMAGE SENSOR PACKAGE, METHOD OF MANUFACTURING THE SAME, AND IMAGE SENSOR MODULE INCLUDING THE IMAGE SENSOR PACKAGE

CROSS-REFERENCE TO RELATED PATENT APPLICATION

This application claims priority under 35 U.S.C. §119 to Korean Patent Application No. 10-2006-0072660, filed on Aug. 1, 2006, in the Korean Intellectual Property Office, the disclosure of which is incorporated herein in its entirety by reference.

BACKGROUND

1. Technical Field

The present invention relates to an image sensor package, a method of manufacturing the same, and an image sensor module including the image sensor package, and more particularly, to an image sensor package which prevents itself from being contaminated by fine particles and can be made slimmer, a method of manufacturing the same, and an image sensor module including the image sensor package

2. Description of the Related Art

Optical electric devices such as semiconductor image sensors (for example, CMOS image sensors) are generally packaged so that they can be connected to high level packages such as large circuit assemblies. Image sensor packages serve several functions including facilitating electrical connection to large circuit assemblies, protecting an image sensor chip from the surrounding environment, and making light or another type of radiation pass through a sensing circuit disposed in the image sensor chip.

As the semiconductor industry grows, manufacturing companies are developing various packaging methods for manufacturing smaller and more reliable semiconductor components. In particular, in a market where miniaturization and slimness are required such as camera phones, Chip On Board (COB), Chip On Film (COF), Chip Size Package (CSP), and similar technologies are widely used.

FIG. 1 is a cross-sectional diagram of an image sensor module packaged by a conventional Chip On Board (COB) method. The COB formed image sensor module illustrated in FIG. 1 includes an image sensor chip 10, a PCB 20 on which the image sensor chip 10 is mounted, a lens unit 30 disposed on the PCB 20 on which the image sensor chip 10 is installed, and a Flexible Printed Circuit (FPC) 40 through which the PCB 20 is connected. The lens unit 30 consists of a lens 32, an infrared ray blocking film 36, and a housing 34, wherein the lens 32 concentrates light into an Active Pixel Sensor (APS) 12 of the image sensor chip 10 and the infrared ray blocking film 36 blocks infrared rays from light that is incident to the image sensor chip 10.

In the COB formed image sensor module of FIG. 1, the PCB 20 and the rear surface of the image sensor chip 10 are adhered using a die adhesive 22 and then input/output electrodes of the image sensor chip 10 are connected with the electrode of the PCB 20 using a bonding wire 24. Since this method is similar to a semiconductor manufacturing process, productivity improves. However, as a space for wire bonding is needed, the size of the image sensor module increases, and as the height of the bonding wire 24 and the space for the infrared ray blocking film 36 are increased, the height of the image sensor module also increases.

FIG. 2 is a cross-sectional diagram of an image sensor module packaged by a conventional Chip On Film (COF) method. In the COF image sensor module illustrated in FIG. 2, the image sensor chip 10 is bonded to a flexible PCB or a flexible printed circuit (FPC) 42 using an Anisotropic Conductive Film (ACF) 23. In this case, bonding wires are not used so as to reduce the width and height of a lens unit 31 and thus a miniaturized and slim image sensor module can be manufactured. However, in order to transmit light to the APS 12 of the image sensor chip 10, a hole at least as wide as the width of the APS 12 should be bored in the flexible PCB or the FPC 42. In this case, the image sensor chin 10 may be contaminated by fine particles originating from the cut part of the FPC 42. In addition, an alignment of the bored flexible PCB or the FPC 42, the image sensor chip 10, and the ACF 23 may be difficult.

As described above, conventional methods of packaging image sensor chips suffer from several drawbacks including large package height, fine particle contamination, and difficult alignment during manufacturing. The present invention addresses these and other disadvantages of the conventional methods.

SUMMARY

The present invention provides a miniaturized and slim image sensor package having reduced susceptibility to contamination by fine particles. The present invention also provides a method of manufacturing the miniaturized and slim image sensor package having reduced susceptibility to contamination by fine particles. The present invention further provides a miniaturized and slim image sensor module using the image sensor package.

According to an aspect of the present invention, there is provided an image sensor package including: a transmissive substrate, the transmissive substrate comprising a depression disposed at the center of the transmissive substrate and a plurality of recesses connecting with the depression disposed along a circumference of the depression; a plurality of external connection pads in which one end of each of the external connection pads is disposed on the transmissive substrate in the depression and the other end of each of the external connection pads is disposed to extend to the edge of the transmissive substrate along the upper surface of the transmissive substrate projected between the recess; and an image sensor chip on which an Active Pixel Sensor (APS) is disposed to face the depression and a plurality of interconnection pads electrically connecting with the external connection pads are disposed around the APS.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
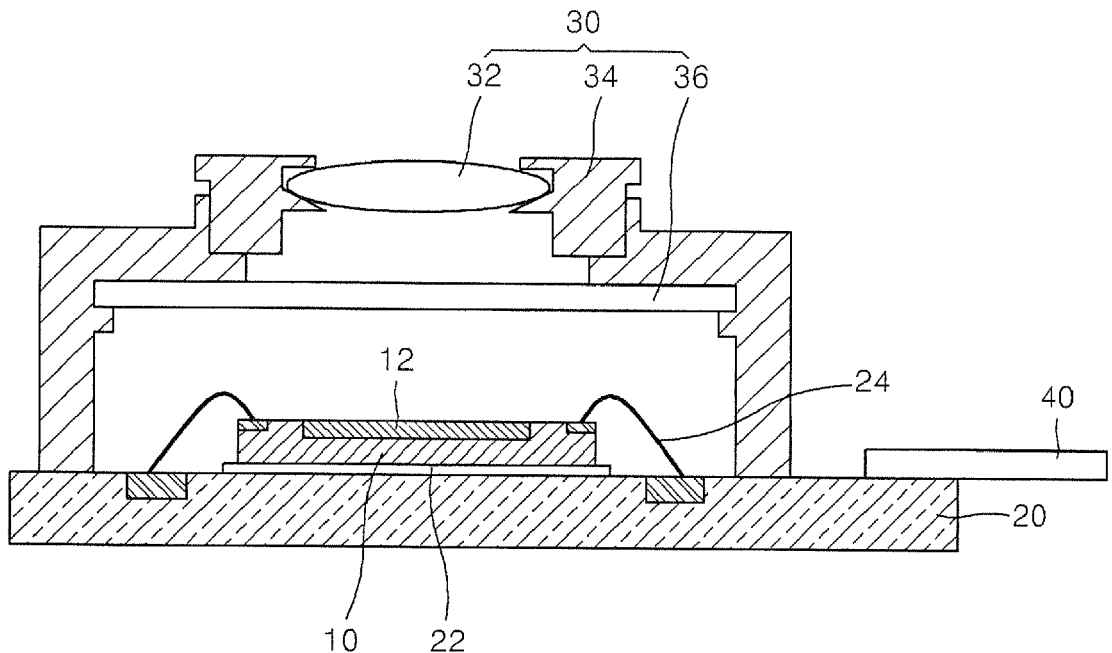
FIG. 1 is a cross-sectional diagram of an image sensor module packaged by a conventional Chip On Board (COB) method.
Figure 2:
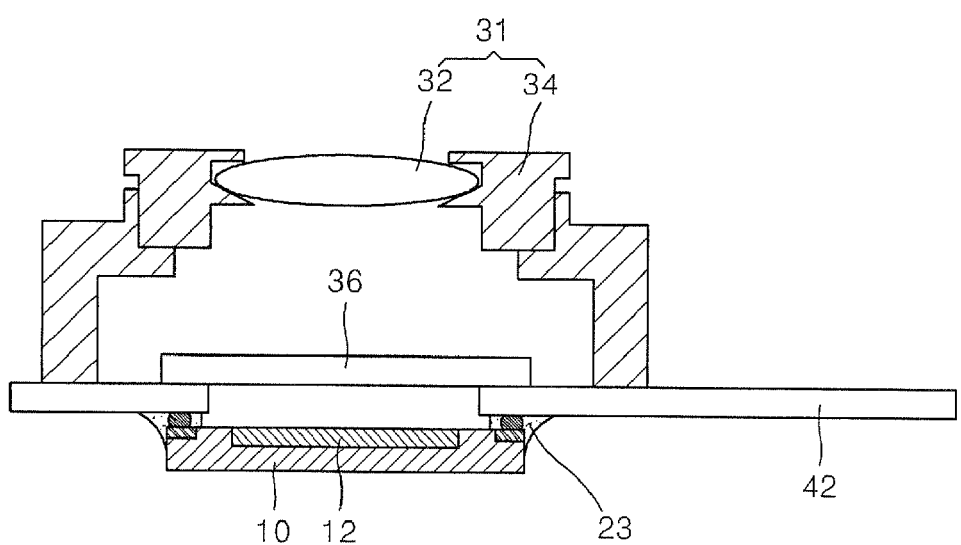
FIG. 2 is a cross-sectional diagram of an image sensor module packaged by a conventional Chip On Film (COF) method.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity.

Figure 3A:
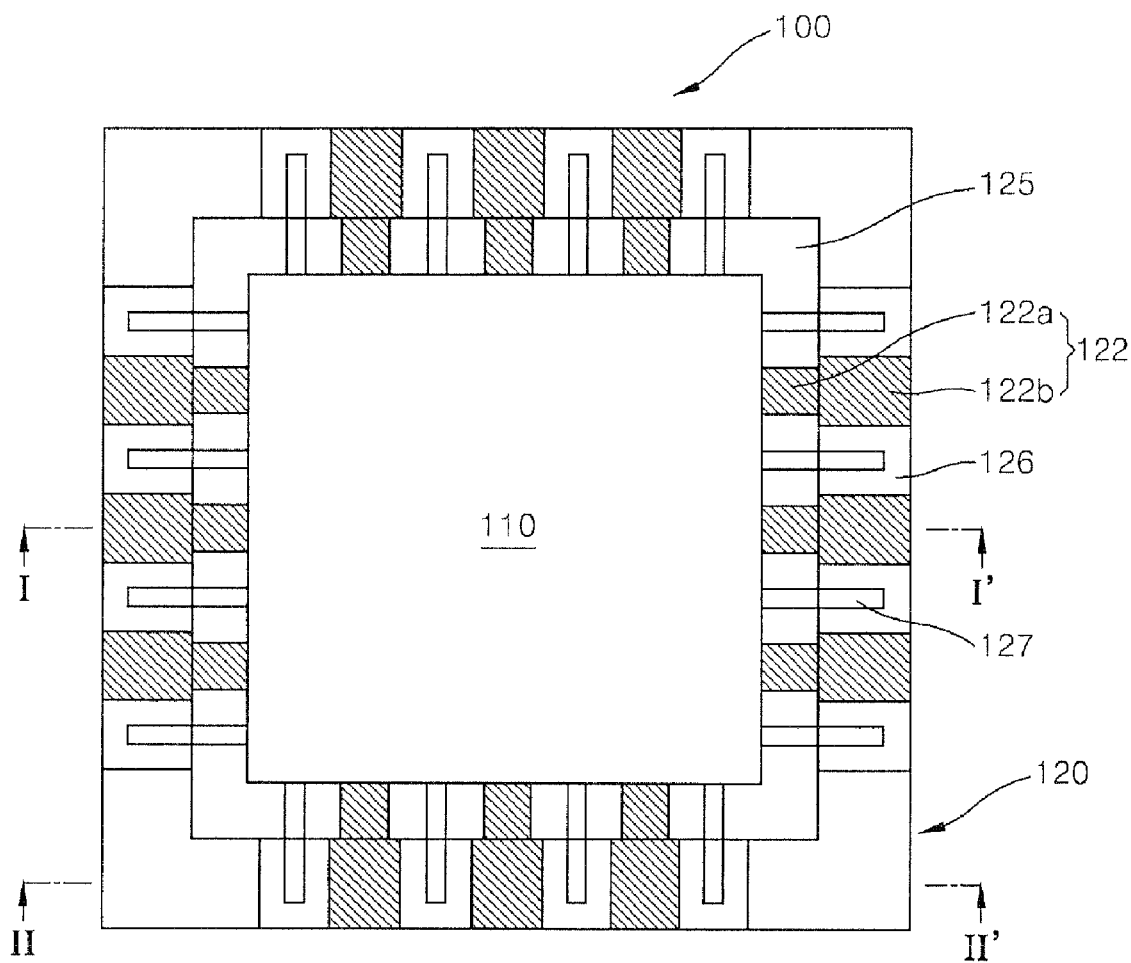
FIG. 3A through 3C are plan view and cross-sectional views schematically illustrating an image sensor package according to an embodiment of the present invention.
Figure 3B:
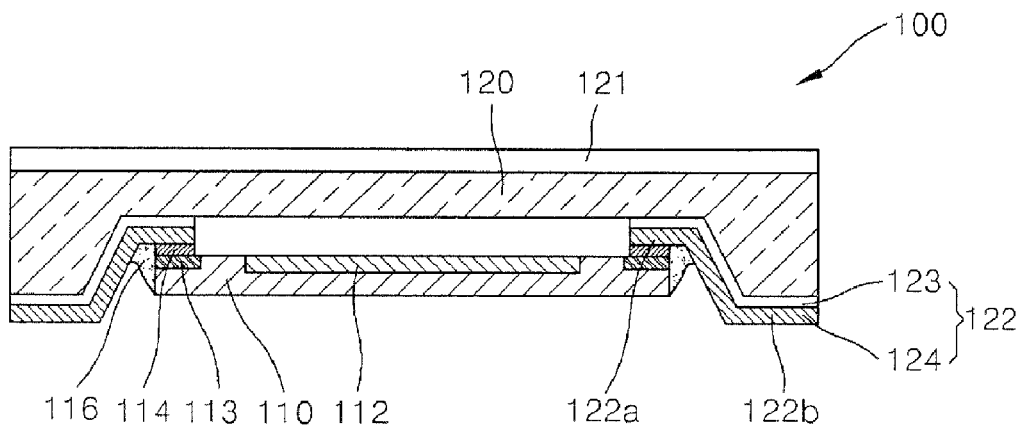
Figure 3C:
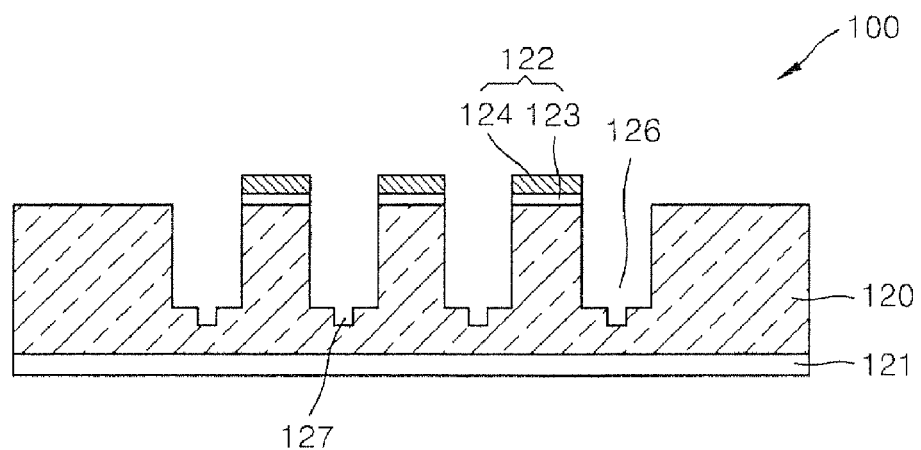

FIG. 3A is a plan view of an image sensor package 100 according to an embodiment of the present invention and FIGS. 3B and 3C are cross-sectional views of the image sensor package 100 of FIG. 3A taken along line I-I' and line II-II', respectively. In FIG. 3A, an adhesive is not illustrated in order to show the structure of the image sensor package 100 more clearly. FIG. 3B illustrates a transmissive substrate 120 of the image sensor package 100 in which light enters, wherein a bottom surface of the transmissive substrate 120 is illustrated at the top. In FIG. 3C, the image sensor package 100 of FIG. 3B is turned upside down. Also, an image sensor chip 110 disposed in the transmissive substrate 120 is not illustrated in FIG. 3C.

In the image sensor package 100 illustrated in FIGS. 3A through 3C, the image sensor chip 110 is included in a depression 125 of the transmissive substrate 120 using a flip-chip method. In this case, an Active Pixel Sensor (APS) 112 of the image sensor chip 110 is disposed to face the bottom of the depression 125 of the transmissive substrate 120. An IR cutting film 121 is coated on the opposite surface from the depression 125 of the transmissive substrate 120. Therefore, light entering through the bottom of the depression 125 of the transmissive substrate 120 may be incident onto the APS 112 of the image sensor chip 110, while infrared rays are blocked by the IR cutting film 121. The APS 112 is disposed approximately at the center of the image sensor chip 110, and an interconnection pad 113 is disposed approximately at the outer circumference of the APS 112. The interconnection pad 113 of the image sensor chip 110 is connected with a chip connection unit 122a of an external connection pad 122 in the transmissive substrate 120, and the chip connection unit 122a of the external connection pad 122 is extended to a circuit board connection unit 122b disposed at an upper portion of the side wall of the depression 125. In FIG. 3A, an inclination of the side wall of the depression 125 is not illustrated in order to simplify the drawing. However, as illustrated in FIG. 3B, the side wall of the depression 125 may be inclined so as to easily form the external connection pad 122.

In the image sensor package 100, the depth of the depression 125 in the transmissive substrate 120 is larger than the height of the image sensor chip 110 and thus the image sensor chip 110 may be substantially completely inserted into the depression 125 in the transmissive substrate 120, thereby reducing the width and height of the image sensor package 100. In addition, as the image sensor chip 110 is sealed in the depression 125 in the transmissive substrate 120 using an adhesive 116, contamination of the image sensor package 100 by fine particles during a manufacturing process of a semiconductor imaging device module can be prevented.

In the current embodiment of the present invention, a recess unit 126 is formed on the side wall of the depression 125 in the transmissive substrate 120 wherein the recess unit 126 is interposed between the circuit board connection units 122b as illustrated in FIGS. 3A through 3C. Accordingly, the side wall of the transmissive substrate 120 has a glass post structure in which the circuit board connection unit 122b is disposed on a post defined by the recess unit 126. Therefore, the circuit board connection units 122b may be substantially completely separated by the recess unit 126 and thus a short circuit can be prevented between the adjacent circuit board connection units 122b. The depth of the recess unit 126 may be the same as or different to the depth of the depression 125. If the depth of the recess unit 126 is different from the depth of the depression 125, the depth of the recess unit 126 may be less than the depth of the depression 125. In addition, the transmissive substrate 120 can be used even if no recess unit 126 is formed on the side wall of the depression 125.

The image sensor chip 110 is bonded to the transmissive substrate 120, for example, using the adhesive 116. The adhesive 116 seals the space between the APS 112 of the image sensor chip 110 and the transmissive substrate 120 from the outside of the interconnection pad 113. Accordingly, the APS 112 is not exposed to the outside of the image sensor package 100 and thus a possibility of contamination can be reduced. In order to bond the image sensor chip 110 to the transmissive substrate 120, the adhesive 116 such as an epoxy film or a dam material may be used. When the adhesive 116 is heated while bonding, outgassing materials may be generated by the adhesive 116. The outgassing materials may contaminate the APS 112 of the image sensor chip 110 if not vented. A groove for outgassing materials emission 127 is formed on the transmissive substrate 120, wherein the groove for outgassing materials emission 127 is extended from the bottom of the depression 125 in the lower part of the adhesive 116 to the recess unit 126, and thus the outgassing materials generated by the adhesive 116 during bonding are moved along the groove for outgassing materials emission 127 and then emitted through the recess unit 126.

Figure 4:
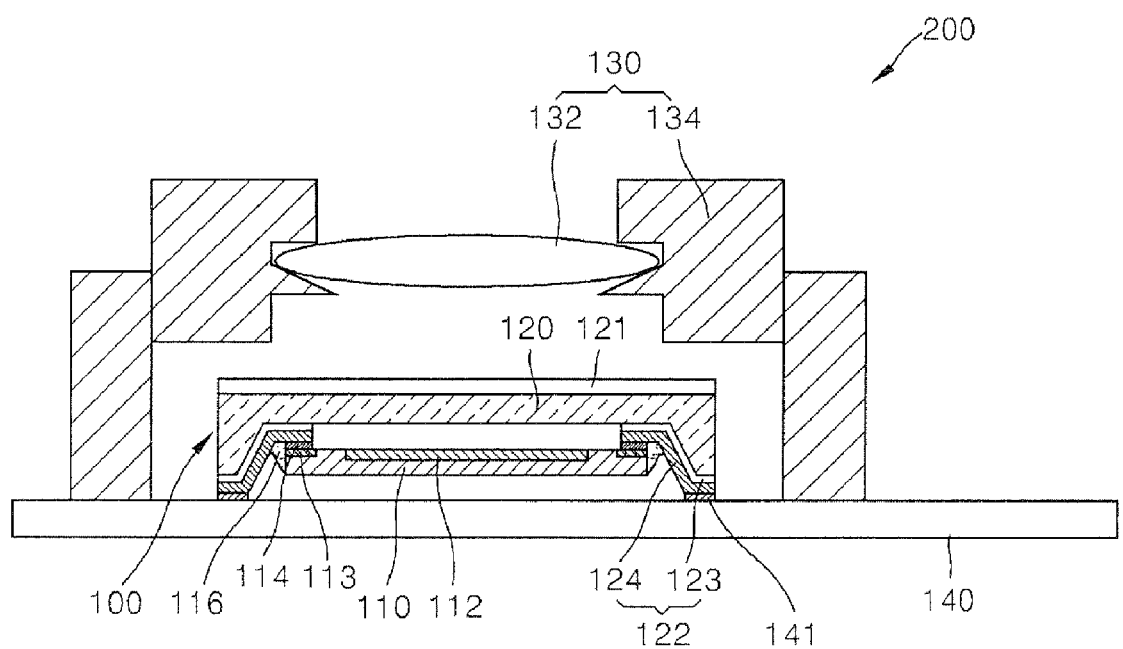
FIG. 4 is a cross-sectional diagram of an image sensor module according to an embodiment of the present invention.

FIG. 4 is a cross-sectional diagram of an image sensor module 200 according to an embodiment of the present invention. Referring to FIG. 4, the image sensor package 100 illustrated in FIGS. 3A through 3C is installed on a circuit board 140 through the external connection pad 122 using, for example, a flip-chip method. The external connection pad 122 may include a seed metal layer 123 and a metallic layer 124 stacked on the seed metal layer 123. The circuit board 140 may be a Flexible Printed Circuit (FPC). In addition, a lens unit 130 in which a lens 132 and a lens housing 134 are included is formed on the circuit board 140 on which the image sensor chip 110 is disposed. Here, the lens 132 is arranged above the APS 112 of the image sensor chip 110 and light collected through the lens 132 passes through the IR cutting film 121 and the transmissive substrate 120 to be incident onto the APS 112 of the image sensor chip 110. Since the size of the image sensor package 100 is small, the size of the lens unit 130 may be decreased and the size of the image sensor module 200 may also be decreased.

Figure 5:
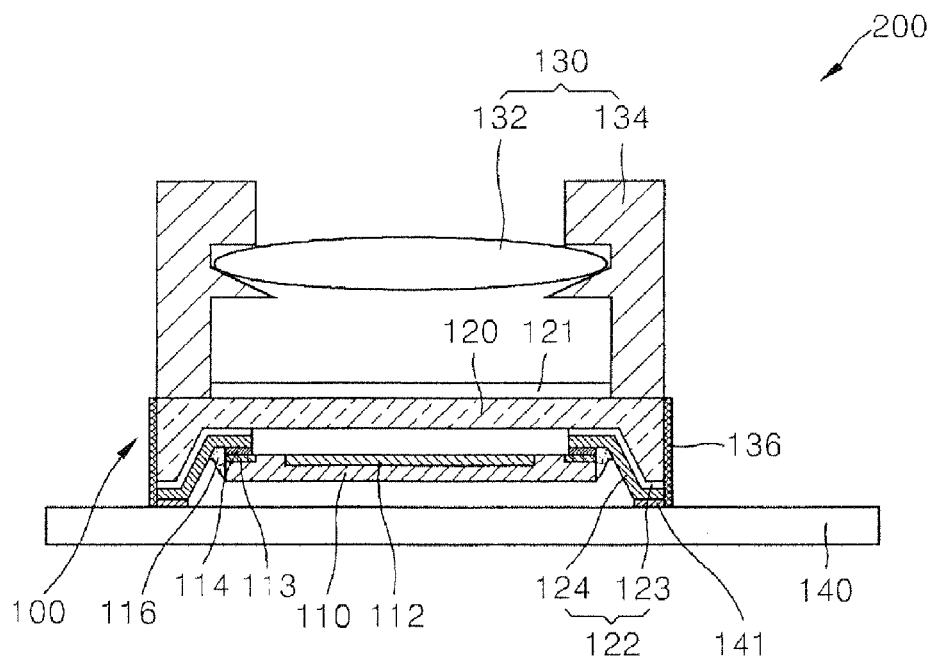
FIG. 5 is a cross-sectional diagram of an image sensor module according to another embodiment of the present invention.

FIG. 5 is a cross-sectional diagram of an image sensor module 300 according to another embodiment of the present invention. As illustrated in FIG. 5, the lens unit 130 can be directly installed on the image sensor package 100 instead of being installed on the circuit board 140. Here, the lens unit 130 can be installed on a portion of the transmissive substrate 120 from which the IR cutting film 121 has been removed or directly on the IR cutting film 121. In this case, the area of the circuit board 140 that was previously occupied by the lens unit 130 is no longer used and thus the size of the image sensor module 200 may be further decreased. Here, the side wall of the transmissive substrate 120 in the image sensor package 100 is coated with a black coating 136 so that the amount of light entering from the side of the image sensor package 100 without passing through the lens 132 can be reduced. The black coating 136 may be an opaque material. On the other hand, since a light blocking material is used as the adhesive 116 disposed around the image sensor chip 110, light entering from the side of the image sensor chip 110 can be further blocked by the adhesive 116. Accordingly, noise of the image sensor module generated by light entering into the APS 112 from places other than the lens 132 can be prevented.

FIG. 6A through 6G are cross-sectional diagrams illustrating a method of manufacturing the image sensor package of FIGS. 3A through 3C according to an embodiment of the present invention.

Figure 6A:
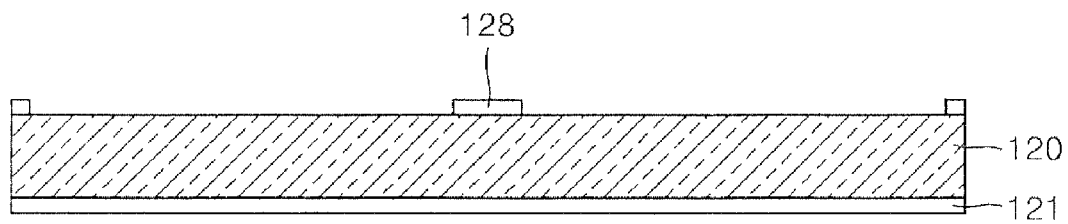
FIG. 6A through 6G are cross-sectional diagrams illustrating a method of manufacturing the image sensor package of FIGS. 3A through 3C according to an embodiment of the present invention.

Referring to FIG. 6A, a mask layer is deposited on a side of the transmissive substrate 120 which is opposite to the side of the transmissive substrate 120 on which the IR cutting film 121 is disposed, and is patterned to form a mask layer pattern 128. The transmissive substrate 120 may have a thickness of approximately 200 to 350 μm. The mask layer may be formed of a photoresist. A transmissive substrate 120 on which the IR cutting film 121 is not coated can also be used. In this case, an IR cutting film 121 can be formed at any convenient stage during the manufacture of a package, for example, in a stage after the image sensor chip 110 is installed on the transmissive substrate 120 and before the image sensor chip 110 is singulated from a wafer.

Figure 6B:
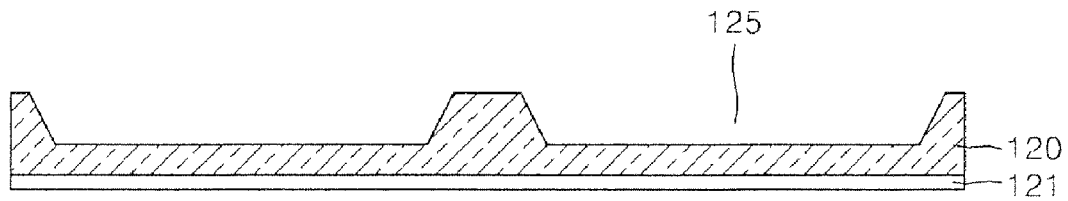

Referring to FIG. 6B, using the mask layer pattern 128 as an etch mask, the transmissive substrate 120 is etched to form the depression 125 at the center of the transmissive substrate 120. The transmissive substrate 120 can be wet-etched using a HF+$H_2PO_3$ solution. The depression 125 may have a thickness of approximately 100 to 300 μm in order for the image sensor chip 110 to be completely inserted into the depression 125. Here, the side wall of the depression 125 should be inclined to form an external connection pad thereon later. Then, the mask layer pattern 128 is removed.

A plurality of recesses (not illustrated) can be formed while the depression 125 is formed, wherein the recesses are connected to the depression 125. The recesses are disposed around a circumference of the depression 125. The recesses isolate circuit board connection units of the external connection pad 122 adjacent to the upper surface of the side wall of the depression 125. Due to these recesses, the side wall of the depression 125 projects between the recesses forming a series of pillar shaped projections. Here, the depth of the recesses are the same as the depth of the depression 125.

Alternatively, the recesses may be formed at any appropriate stage after the depression 125 is formed.

Figure 6C:
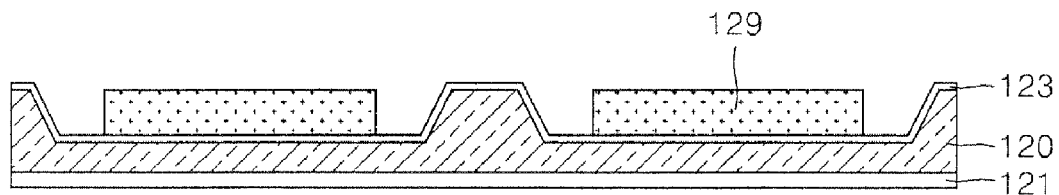

Referring to FIG. 6C, in order to form the external connection pad 122, the seed metal layer 123 is formed on the transmissive substrate 120 on which the depression 125 is formed. The seed metal layer 123 acts as a seed to form the metallic layer 124 thereon. The seed metal layer 123 can be formed using a sputter deposition process including a Ti/Cu layer, a Ti/Ni layer, or a Ti/Au layer. Then, a polymer dielectric pattern 129 is formed on the seed metal layer 123 at a portion of the seed metal layer 123 which exposes a portion in which the external connection pad 122 will be connected.

Figure 6D:
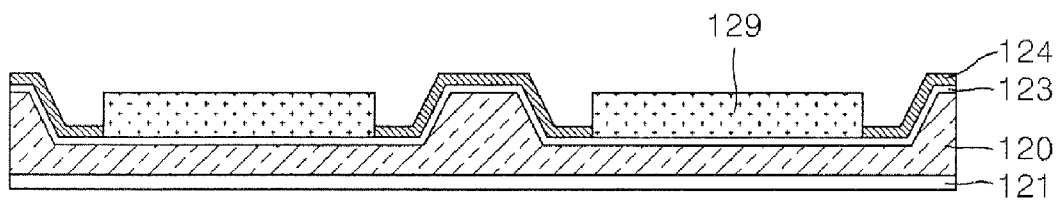

Referring to FIG. 6D, the metallic layer 124 is formed on the part of the seed metal layer 123 in which the external connection pad 122 will be connected. The metallic layer 124, for example, a Ni or Au layer, can be formed on the part of the seed metal layer 123 on which the polymer dielectric pattern 129 is not formed by electroplating.

Figure 6E:
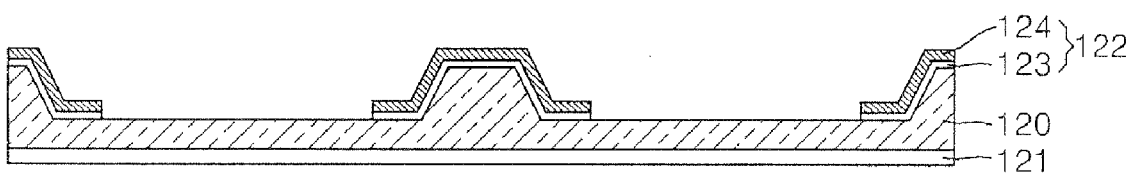

Referring to FIG. 6E, the polymer dielectric pattern 129 is removed and then the part of the seed metal layer 123 on which the metallic layer 124 is not formed is removed. Accordingly, the external connection pad 122 formed of the seed metal layer 123 and the metallic layer 124 is formed. The seed metal layer 123 on which the metallic layer 124 is not formed can be removed by wet etching. One end of the external connection pad 122 is disposed on the transmissive substrate 120 in the depression 125 and the other end thereof is disposed to extend to the edge of the transmissive substrate 120 along the upper surface of the transmissive substrate 120 projected between the recesses (not illustrated). The part of the external connection pad 122 which is disposed on the transmissive substrate 120 in the depression 125 is connected to the interconnection pad 113 of the image sensor chip 110 as described below. In addition, the part of the external connection pad 122 which is extended to the edge of the transmissive substrate 120 along the upper surface of the transmissive substrate 120 is connected to an external circuit board in a subsequent step. Therefore, an electric signal of the image sensor chip 110 can be transmitted to the external circuit board of the image sensor module through the external connection pad 122.

Meanwhile, when the recesses disposed around the depression 125 are not formed at the same time as the depression, recesses can be formed after the external connection pad 122 is formed. In this case, the depth of the recesses can be the same as or different from the depth of the depression 125. When the depths of the recesses and the depression 125 are different, the depth of the recesses may be smaller than that of the depression 125.

Figure 6F:
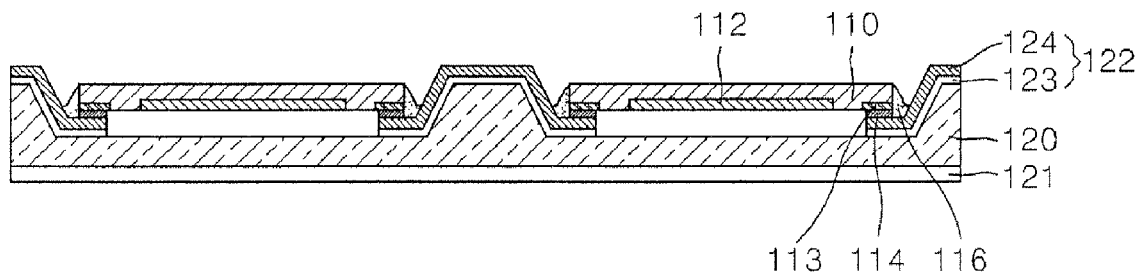

Referring to FIG. 6F, the image sensor chip 110 is arranged in the depression 125 of the transmissive substrate 120 so that the interconnection pad 113 of the image sensor chip 110 connects with the external connection pad 122 of the transmissive substrate 120. In this case, the adhesive 116, which is for example a Non Conductive Film (NCF), is punched so that portions are removed, leaving behind the portions through which the external connection pad 122 is connected with the interconnection pad 113 of the image sensor chip 110. Then, the punched NCF is disposed on the external connection pad 122. Subsequently, the image sensor chip 110 is arranged on the transmissive substrate 120 to perform thermal compression. Then, the interconnection pad 113 of the image sensor chip 110 is connected with the external connection pad 122 of the transmissive substrate 120 through a metal bump 114 formed on the interconnection pad 113, and the image sensor chip 110 can be bonded to the transmissive substrate 120 by the adhesive 116.

Figure 7:
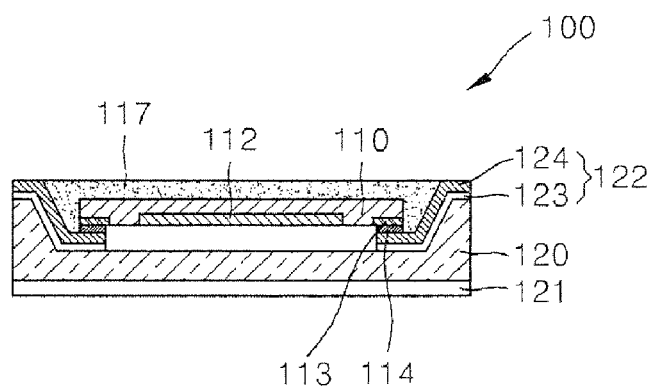
FIG. 7 is a cross-sectional diagram of an image sensor package manufactured using an ultrasonic bonding method.

Alternatively, the image sensor chip 110 can be connected to the transmissive substrate 120 using an ultrasonic bonding method as illustrated in FIG. 7 and then an adhesive 117 such as dam material can be applied and hardened to bond the image sensor chip 110 thereto. Here, the dam material has less mobility so as not to flow into the APS 112 and seals the image sensor chip 110 in the depression 125 of the transmissive substrate 120. In the case of ultrasonic bonding, the interconnection pad 113 of the image sensor chip 110 can be connected to the external connection pad 122 of the transmissive substrate 120 through the metal bump 114.

Figure 6G:
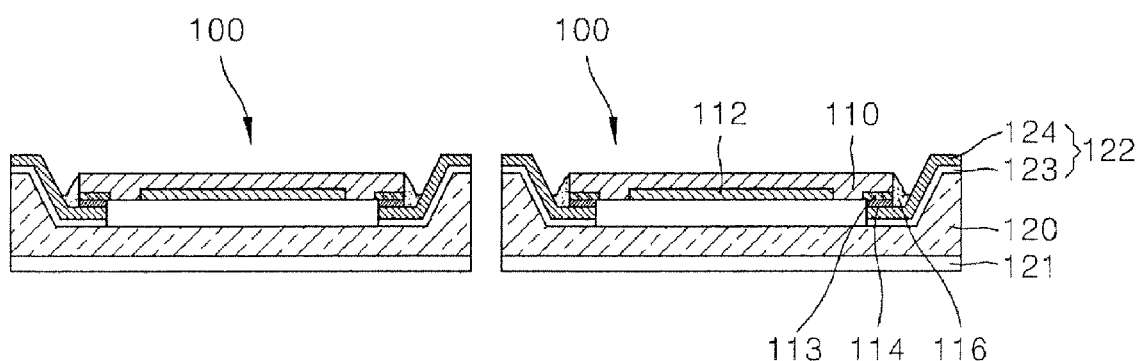

Referring to FIG. 6G, the transmissive substrate 120 on which the image sensor chip 110 is bonded is diced so that the image sensor package 100 can be individually separated. Although not illustrated, the side of the transmissive substrate 120 is coated with a black material after the transmissive substrate 120 is diced into the individual image sensor package 100, so as to reduce light entering from the side of the transmissive substrate 120. Also, the side of the transmissive substrate 120 may be coated with an opaque material.

In the image sensor package according to the present invention, the image sensor chip is disposed in the depression of the transmissive substrate so as to reduce size and contamination of the image sensor package. Meanwhile, since the recesses are formed between the circuit board connection units disposed on the side wall of the depression of the transmissive substrate, a short circuit can be prevented between the adjacent circuit board connection units when the image sensor package is connected to the circuit board to form the image sensor module.

In addition, the groove, which is extended from the bottom of the depression in the lower part of the adhesive to the recesses disposed on the side wall of the depression, allows outgassing materials generated by the adhesive, which is used to bond the image sensor chip to the transmissive substrate, to be emitted and thus outgassing materials can be prevented from remaining in the depression of the transmissive substrate and contaminating the image sensor chip.

Meanwhile, in the image sensor module, the lens unit is disposed on the transmissive substrate to reduce the size of the image sensor module. In this case, the outer side wall of the transmissive substrate is coated with a black or opaque material to reduce light entering from the side wall of the transmissive substrate into the image sensor chip.

According to an aspect of the present invention, there is provided an image sensor package including: a transmissive substrate, wherein a depression is formed at the center of the transmissive substrate and a plurality of recesses connecting with the depression are formed along the depression; a plurality of external connection pads in which one end of each of the external connection pads is disposed on the transmissive substrate in the depression and the other end of each of the external connection pads is disposed to extend to the edge of the transmissive substrate along the upper surface of the transmissive substrate projected between the recesses; and an image sensor chip on which an Active Pixel Sensor (APS) is disposed to face the depression and a plurality of interconnection pads electrically connecting with the external connection pads are formed around the APS.

An IR cutting film may be formed on the opposite surface on which the depression is formed in the transmissive substrate.

The depth of the depression may be larger than the height of the image sensor chip.

The external connection pads of the transmissive substrate may include a first part to which the interconnection pads of the image sensor chip are connected, the first part being disposed at the bottom of the depression, and a second part to which a circuit board is connected, the second part being disposed at an upper surface of the transmissive substrate.

The image sensor package may further include a metal bump interposed between the external connection pad of the transmissive substrate and the interconnection pad of the image sensor chip.

The image sensor package may further include an adhesive which seals around the image sensor chip and bonds the image sensor chip to the transmissive substrate.

The image sensor package may further include a plurality of grooves which extend from the bottom of the depression on which the adhesive is formed to the recesses disposed around the depression, in order to emit gas generated during bonding using the adhesive.

The external connection pad may include a Ni or Au metal layer formed on a seed metal layer, wherein the seed metal layer comprises Ti/Cu, Ti/Ni, or Ti/Au.

According to another aspect of the present invention, there is provided an image sensor module including: a circuit board; an image sensor package comprising: a transmissive substrate electrically bonded to the circuit board, wherein a depression is formed at the center of a first surface in the transmissive substrate and a plurality of recesses connected with the depression are formed along the depression; a plurality of external connection pads formed on the first surface of the transmissive substrate, wherein one end of each of the external connection pads is disposed in the depression and the other end of each of the external connection pads is disposed to extend to the edge of the transmissive substrate; and an image sensor chip on which an Active Pixel Sensor (APS) is formed to face the depression and a plurality of interconnection pads electrically connecting with the external connection pads are formed around the APS; and a lens unit disposed above a second surface of the transmissive substrate to face the APS.

The second surface of the transmissive substrate may include an IR cutting film formed thereon.

The lens unit may be installed on the second surface of the transmissive substrate or on the circuit board. In this case, the outer side wall of the transmissive substrate of the image sensor package may be coated with an opaque material.

According to another aspect of the present invention, there is provided a method of manufacturing an image sensor package including: forming a depression on a first surface of a transmissive substrate; forming a plurality of external connection pads, wherein one end of each of the external connection pads is disposed on the transmissive substrate in the depression and the other end of each of the external connection pads is disposed to extend to the edge of the transmissive substrate along the upper surface of the transmissive substrate projected between a plurality of recesses; and installing in the depression an image sensor chip, on which an Active Pixel Sensor (APS) is formed and interconnection pads are formed around the APS, so that the APS faces the transmissive substrate and the interconnection pads connect with the external connection pads.

The depth of the depression may be about 100-300 μm.

The forming of the depression on the first surface of the transmissive substrate may be performed when the recesses which connect with the depression are formed along the depression, or the method may further include forming a plurality of recesses which connect with the depression along the depression on a first surface of the transmissive substrate after the external connection pads are formed on the transmissive substrate and before the image sensor chip is installed on the transmissive substrate.

The forming of the depression may include forming a mask pattern on the first surface of the transmissive substrate; etching the transmissive substrate using the mask pattern as an etching mask; and removing the mask pattern after the transmissive substrate is etched.

The etching of the transmissive substrate may include etching using a solution obtained by mixing a hydrofluoric acid (HF) and a phosphoric acid ($H_2PO_3$).

The forming of the external connection pads may include forming a seed metal layer on the first surface of the transmissive substrate on which the depression is formed; forming a mask layer pattern on the seed metal layer; forming a metallic layer on the seed metal layer exposed by the mask layer pattern by electroplating; removing the mask layer pattern after the metallic layer is formed; and removing the on which the metallic layer is not formed, the seed metal layer having removed mask layer pattern. Here, the seed metal layer may comprise Ti/Cu, Ti/Ni, or Ti/Au and the metallic layer may comprise Ni or Au.

The image sensor chip may be installed onto the transmissive substrate by a flip-chip method.

The image sensor chip may further include a metal bump on the interconnection pad, and installing the image sensor chip onto the transmissive substrate may include forming an epoxy film at one end of each of the external connection pads in the depression; and arranging the interconnection pad of the image sensor chip on which the metal bump is formed, to be disposed at one end of the external connection pad on which the epoxy film is formed; and performing thermal compression of the transmissive substrate and the image sensor chip, or arranging the interconnection pad of the image sensor chip on which the metal bump is formed, to be disposed at one end of the external connection pad in the depression to perform ultrasonic bonding; and filling dam material between the outer surface of the image sensor chip ultrasonically bonded and the side wall of the depression to harden the dam material.

The epoxy film or the dam material may be a light blocking material.

The method may further include forming a plurality of grooves which extend from the bottom of the depression of the transmissive substrate to the recesses, after forming the external connection pads and before installing the image sensor chip onto the transmissive substrate.

The method may further include forming an IR cutting film on a second surface of the transmissive substrate which is opposite to the first surface of the transmissive substrate, before forming the depression.

The method may further include forming an IR cutting film on the second surface of the transmissive substrate after installing the image sensor chip onto the transmissive substrate.

According to another aspect of the present invention, there is provided a method of manufacturing an image sensor module including: bonding the image sensor package manufactured according to the method described above to a circuit board; and placing a lens unit above a second surface of a transmissive substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor package comprising:
a light-transmissive substrate, the light-transmissive substrate comprising a depression disposed at approximately the center of the light-transmissive substrate and a plurality of recesses connecting with the depression disposed along the circumference of the depression;
a plurality of external connection pads in which one end of each of the external connection pads is disposed on the light-transmissive substrate in the depression and the other end of each of the external connection pads is disposed to extend to the edge of the light-transmissive substrate along an upper surface of the light-transmissive substrate projected between the recesses, wherein the recesses separate the external connection pads from each other to prevent a short circuit between adjacent external connection pads; and
an image sensor chip on which an Active Pixel Sensor (APS) is disposed to face the depression and including a plurality of interconnection pads around the APS electrically connecting with the external connection pads.

2. The image sensor package of claim 1, further comprising an IR cutting film disposed on the opposite surface of the light-transmissive substrate from the depression.

3. The image sensor package of claim 1, wherein the depth of the depression is larger than the height of the image sensor chip.

4. The image sensor package of claim 1, wherein the external connection pads comprise a first part to which the interconnection pads of the image sensor chip are connected at the bottom of the depression and a second part to which a circuit board is connected at the upper surface of the light-transmissive substrate.

5. The image sensor package of claim 1, further comprising a metal bump interposed between each of the external connection pads and the interconnection pads.

6. The image sensor package of claim 1, further comprising an adhesive which seals around the image sensor chip and bonds the image sensor chip to the light-transmissive substrate.

7. The image sensor package of claim 6, further comprising a plurality of grooves which extend from the bottom of the depression on which the adhesive is formed to the recesses disposed around the depression.

8. The image sensor package of claim 1, wherein the external connection pad comprises a Ni or Au metal layer formed on a seed metal layer, wherein the seed metal layer is formed of Ti/Cu, Ti/Ni, or Ti/Au.

9. An image sensor module comprising:
a circuit board;
an image sensor package comprising:
a light-transmissive substrate electrically bonded to the circuit board,
wherein a depression is disposed at the center of a first surface in the light-transmissive substrate and a plurality of recesses connected with the depression are disposed along a circumference of the depression;
a plurality of external connection pads disposed on the first surface of the light-transmissive substrate, wherein one end of each of the external connection pads is disposed in the depression and the other end of each of the external connection pads is disposed to extend to the edge of the light-transmissive substrate along an upper surface of the light-transmissive substrate projected between the recesses, wherein the recesses separate the external connection pads from each other to prevent a short circuit between adjacent external connection pads; and
an image sensor chip on which an Active Pixel Sensor (APS) is disposed to face the depression and a plurality of interconnection pads electrically connecting with the external connection pads are disposed around the APS; and
a lens unit disposed above a second surface of the light-transmissive substrate.

10. The image sensor module of claim 9, wherein the second surface of the light-transmissive substrate comprises an IR cutting film.

11. The image sensor module of claim 9, wherein the lens unit is installed on the second surface of the light-transmissive substrate.

12. The image sensor module of claim 9, wherein the lens unit is installed on the circuit board.

13. The image sensor module of claim 9, wherein an outer side wall of the light-transmissive substrate of the image sensor package is coated with an opaque material.

* * * * *